(12) United States Patent
Stanley et al.

(10) Patent No.: US 10,687,632 B1
(45) Date of Patent: Jun. 23, 2020

(54) PCM CONTAINING LIQUID SATURATED FOAM DEVICE

(71) Applicant: Soothsoft Innovations Worldwide, Inc., Grand Island, NE (US)

(72) Inventors: Eric David Stanley, Yarmouth, ME (US); Michelle Lorraine Mariani, Grand Island, NE (US)

(73) Assignee: Soothsoft Innovations Worldwide, Inc., Grand Island, NE (US)

( * ) Notice: Subject to any disclaimer, the term of this patent is extended or adjusted under 35 U.S.C. 154(b) by 107 days.

(21) Appl. No.: 15/089,581

(22) Filed: Apr. 3, 2016

(51) Int. Cl.
| | |
|---|---|
| *A47C 21/04* | (2006.01) |
| *A47G 9/10* | (2006.01) |
| *A47C 27/08* | (2006.01) |
| *F28D 20/02* | (2006.01) |

(52) U.S. Cl.
CPC .......... *A47C 21/046* (2013.01); *A47C 27/088* (2013.01); *A47G 9/1036* (2013.01); *F28D 20/021* (2013.01); *F28D 20/023* (2013.01)

(58) Field of Classification Search
CPC ...... F28D 20/02; F28D 20/021; F28D 20/023; F28D 20/025; A47C 21/04; A47C 21/042; A47C 21/046; A47C 21/048; A47C 27/085; A47C 27/088; A47G 9/1036; A01K 1/0157; A01K 1/0158; A01K 1/0353
See application file for complete search history.

(56) References Cited

U.S. PATENT DOCUMENTS

| | | | |
|---|---|---|---|
| 2,595,328 A | * | 5/1952 | Bowen ............... F28D 20/02 165/46 |
| 4,596,250 A | | 6/1986 | Beisang, III et al. |
| 4,856,294 A | | 8/1989 | Scaringe et al. |
| 4,964,402 A | | 10/1990 | Grim et al. |
| 4,981,135 A | | 1/1991 | Hardy |
| 5,069,208 A | | 12/1991 | Noppel et al. |
| 5,211,949 A | | 5/1993 | Salyer |
| 5,370,814 A | | 12/1994 | Salyer |
| 5,423,996 A | | 6/1995 | Salyer |

(Continued)

FOREIGN PATENT DOCUMENTS

| | | |
|---|---|---|
| EP | 01201219 | 5/2002 |
| WO | WO 1990001911 | 3/1990 |

(Continued)

*Primary Examiner* — Eric S Ruppert
*Assistant Examiner* — Hans R Weiland
(74) *Attorney, Agent, or Firm* — Lee G. Meyer, Esq.; Meyer & Associates, LLC

(57) ABSTRACT

A self-contained active thermal regulating device includes a flexible, deformable outer membrane; a liquid saturated foam core contained therein having a dimension substantially coincident with the outer membrane wherein the liquid is at least partially circulable throughout the foam core; and, a phase change material being in intimate contact with the circulable liquid. The circulation of the liquid is effective to transfer heat between the flexible, deformable outer membrane and the phase change material to cool (or heat) the device without use of external power and the saturated foam core in cooperation with the sealable flexible membrane providing a substantially uniform, thermal regulating medium and structural support such that the device is readily, uniformly deformable when a load is applied thereto.

20 Claims, 2 Drawing Sheets

(56) References Cited

U.S. PATENT DOCUMENTS

| | | | |
|---|---|---|---|
| 5,424,519 A * | 6/1995 | Salee | A61F 7/03 219/759 |
| 5,477,917 A | 12/1995 | Salyer | |
| 5,499,460 A | 3/1996 | Bryant et al. | |
| 5,534,020 A | 7/1996 | Cheney, III | |
| 5,552,075 A | 9/1996 | Salyer | |
| 5,650,090 A | 7/1997 | Salyer | |
| 5,804,266 A | 9/1998 | Salyer | |
| 5,991,948 A * | 11/1999 | Stanley | A47C 21/048 5/421 |
| 6,099,555 A | 8/2000 | Sabin | |
| 6,125,645 A | 10/2000 | Horn | |
| 6,132,455 A | 10/2000 | Shang | |
| 6,207,738 B1 | 3/2001 | Zuckerman | |
| 6,393,843 B2 | 5/2002 | Kohout | |
| 6,412,545 B1 | 7/2002 | Buff et al. | |
| 6,482,332 B1 * | 11/2002 | Malach | C09K 5/066 165/10 |
| 6,598,251 B2 | 7/2003 | Habboub | |
| 6,699,266 B2 | 3/2004 | Lachenbruch et al. | |
| 6,755,852 B2 | 6/2004 | Lachenbruch et al. | |
| 6,764,502 B2 | 7/2004 | Bieberich | |
| 6,881,219 B1 | 4/2005 | Aganivai et al. | |
| 6,904,617 B2 | 6/2005 | Tsai | |
| 7,021,848 B1 | 4/2006 | Gruenbacher et al. | |
| 7,056,335 B2 * | 6/2006 | Agarwal | A61F 7/03 252/70 |
| 7,320,357 B2 | 1/2008 | Pause | |
| 7,666,500 B2 * | 2/2010 | Magill | D01D 5/24 428/370 |
| 8,449,588 B2 | 5/2013 | Horn | |
| 2001/0008072 A1 | 7/2001 | Kohout | |
| 2003/0109910 A1 | 6/2003 | Lachenbruch et al. | |
| 2003/0109911 A1 | 6/2003 | Lachenbruch et al. | |
| 2006/0172647 A1 | 8/2006 | Mehta et al. | |
| 2007/0130840 A1 | 6/2007 | Jouhannet | |
| 2008/0141681 A1 | 6/2008 | Arnold | |
| 2008/0168595 A1 | 7/2008 | Almqvist | |
| 2010/0107657 A1 | 5/2010 | Vistakula | |
| 2012/0193572 A1 * | 8/2012 | MacKay | A47C 21/046 252/78.1 |
| 2012/0284918 A1 * | 11/2012 | Gazagnes | A61G 7/05769 5/421 |
| 2012/0285191 A1 | 11/2012 | Gallaher | |
| 2013/0103125 A1 * | 4/2013 | Radspieler | F28D 20/02 607/104 |
| 2013/0289680 A1 | 10/2013 | Hasegawa | |
| 2014/0128945 A1 | 5/2014 | Schoning | |
| 2014/0182063 A1 | 7/2014 | Crawford et al. | |
| 2016/0168439 A1 * | 6/2016 | Ayambem | C09K 5/063 428/402 |

FOREIGN PATENT DOCUMENTS

| | | |
|---|---|---|
| WO | WO 9636200 | 11/1996 |
| WO | WO 1997035942 | 10/1997 |
| WO | WO 2000003667 | 1/2000 |
| WO | WO 2000024348 | 5/2000 |
| WO | WO 2002030251 | 4/2002 |
| WO | WO 03008500 | 1/2003 |
| WO | WO 2004037945 A2 | 5/2004 |
| WO | WO 2004037945 A3 | 5/2004 |
| WO | WO 2005101466 | 10/2005 |
| WO | WO 2006065663 | 6/2006 |

* cited by examiner

PCM CONTAINING LIQUID SATURATED FOAM DEVICE

BACKGROUND

Field

The instant application relates to a liquid saturated, PCM containing, foam filled device for simultaneously supporting and acting as a thermal regulator; and, more specifically, to an active liquid saturated, PCM containing, foam filled cushioning support device for support and thermal regulation having application in, for example, the medical field, personal comfort field, in the electronics field, as well as for recreational use.

Related Art

It has long been recognized that there are certain advantages to liquid containing devices in a flexible or malleable containers, which support and/or act as thermal modulators. The inherent drawbacks of such devices are that the liquid within the container moves freely without restriction and is required to bear the entire weight of a person or object placed thereon. Further, when such devices are bent, or "wrapped" around an object, they tend to kink since the liquid is able to be totally displaced at the bend. Some such devices have relied upon increasing the pressure of the liquid within the container as an object is placed upon the container in order to provide support. This reduces the flexibility, as well as making these devices bulky. Finally, these devices rely solely on the heat capacity of the liquid to heat and/or cool, unless an exterior power source is used.

Many water-bed or water-pillow type devices exist wherein fillers or "baffles" have been placed within these prior art devices in order to avoid sloshing or swishing of the liquid within the device and to help increase support. These devices, including water filled devices, also tend to kink or bend when a load is applied, for example, in wrapping such a device around one's arm, leg, etc. It has been determined that even multi-chambered apparatuses are not satisfactory. The requirement for the liquid to flow freely in the device necessitates, for example, complicated valving between chambers within the device.

Containers or continuous covers, such as sealable vinyl bags and the like, have also been filled with foams of various descriptions in order to alleviate some of the problems inherent in the liquid filled devices. These foam-containing devices use the air filled foam structure as a support, but do not provide the heat transferability of a liquid, or the malleable support afforded by liquid containing foam. In addition, these devices are thermally passive.

Gels and other fillers have also been employed in a similar manner to reduce the inherent wave motion of liquid filled devices. However, because these gels and other fillers do not flow easily, i.e. they are very viscous; they are not able to dissipate the heat readily. These passive cooling systems suffer a further disadvantage in that the thermal capacity of the device is limited to that of the heat capacity of the device. Likewise, passive liquid saturated foam devices reach a thermal capacity, even though liquid circulates through the foam, greatly reducing passive liquid saturated foam devices thermal regulating affect.

Thus, these prior art liquid filled and/or gel filled devices only have the ability to dissipate and/or absorb heat up to the heat capacity of the material used to manufacture and/or operate the device. Therefore, there is needed a liquid saturated foam device that provides support, yet allows flow of the liquid therethrough in order to dissipate heat, but provides an internal active medium for regulating the temperature (heating or cooling) without the requirement for utilizing electricity or other external power source.

SUMMARY

It has now been discovered that by saturating the foam core of a foam filled, flexible, liquid impervious container or envelope with a liquid wherein the liquid is in contact, directly or indirectly, with a phase change material (PCM), the structural stability, as well as the load bearing ability of the device can be enhanced while still allowing mobility of the liquid within the device to provide active thermal regulation due to phase change of the PCM. This active device is self-contained and requires no external source of power or energy.

Thus, the instant device utilizes the relationship between the sealed envelope (liquid impervious sealed outer membrane), the liquid-saturated foam core, and the PCM to provide the novel support and the circulability of the liquid within the core, as well as active thermal regulation of the PCM, thus obviating the need for external power and/or multiple chambers and/or restrictive valving system between such chambers. The PCM provides a unique aspect to the natural, thermally induced flow of the liquid in the device by contributing a synergistically active, internal thermal regulation capacity to a closed system. Thus, utilizing the natural convective circulation of the liquid facilitates distribution of heat such that the latent heat of formation of the PCM provides an active "heat sink" capacity to the device.

The foam of the present invention allows flow and/or migration of the liquid material which is at least partially circulable through the foam core within the confines of a single device, as well as contact of the liquid with the PCM, while the liquid saturation provides stability and support for the user. In accordance with this concept, the heat causes convective movement of the liquid which is circulable through the foam core to bring the liquid in continuous contact with the solid PCM which undergoes an endothermic phase shift to liquid, thus making the device active for the absorption of heat, i.e. active cooling within the closed system without the use of an external power source. When the device is not in use, it returns to ambient temperature, and the liquid PCM returns to a solid, giving up heat, i.e. exothermally. Thus, the device can have an active heating or cooling effect depending upon the phase change of the PCM. Additionally, there is no requirement for complex valving devices disposed in a membrane to move liquid back and forth between sealed chambers and/or contact the PCM.

In accordance with one embodiment, there is provided water saturated, foam filled flexible device having a flexible, liquid impervious deformable outer membrane encapsulating the water saturated foam core through which the water circulates, which foam core has substantially the same dimensions as the membrane and wherein the circulating water within the foam is in circulating contact with the PCM. The PCM may be housed or contained within the saturated foam core; or be in contact with the exterior thereof, such as between the surface of the foam core and the interior of the flexible, outer membrane. In one embodiment, the PCM is encapsulated within liquid impenetrable, heat conductive vessels, containers, or structures which are distributed throughout the foam.

The PCM can be incorporated in the device in any manner so long as it is able to undergo phase change, e.g. from solid to liquid or from one solid state to another, upon absorption of heat from the circulating liquid and then returned to its former phase, i.e. solid by dissipation of heat. In one embodiment, the PCM is contained in a thermally transferring liquid impenetrable grid ("waffle") like structure which is retained ("sandwiched") within the foam filler. In another embodiment, the PCM is contained in a plurality of extruded, sealed filaments which are formed or woven into a "mat" which may be contained within the foam filler, or in contact with the top or bottom thereof. In accordance with these embodiments, the PCM is presented in a small cross sectional area to the movement of the liquid within the device, thus allowing efficient heat transfer to or from the PCM.

In another embodiment, PCM can be contained in a liquid-permeable membrane such as an osmotic membrane (mole sieve) within the device such that the device liquid can flow through the membrane, but the PCM, in its liquid state, cannot. In this embodiment, a pouch or other suitable membrane enclosure is retained within the device in contact with the circulating liquid to allow the liquid within the device to pass through the membrane enclosure containing the PCM therein, thus contacting the PCM, but preventing the liquid phase of the PCM from exiting the membraned enclosure, thus retaining the PCM (liquid and/or solid) within the confines of the membraned enclosure at all times. For PCM which undergoes only a solid state reformation, the PCM can be contained in a liquid-permeable membrane, provided the PCM is resistant to degradation by the device liquid.

The liquid saturated foam filled flexible container has application as a personal cooling device. In another aspect, the device provides a pad or "mattress" for a human or an animal which, when drained of liquid, is lightweight and compact and, when filled with liquid, has high support characteristics and provides cushioning for pressure contact points of the user, as well as an active cooling device. In a further aspect, the device has application for cooling of electronics and particularly those which cycle "on" and "off."

Other aspects and features of the present invention will become apparent to those ordinarily skilled in the art upon reading specification, including the claims in light of the drawings.

Before explaining the disclosed embodiment of the present invention in detail, it is to be understood that the invention is not limited in its application to the details of the particular arrangement shown, since the invention is capable of other embodiments. Additionally, the terminology used herein is for the purpose of description and not of limitation.

DESCRIPTION

System Nomenclature

Convection shall mean the transfer of heat from one place to another by the movement of fluids. Convection is usually the dominant form of heat transfer (convection) in liquids and gases. Convective heat transfer, as used herein, involves the combined processes of conduction (heat diffusion) and advection (heat transfer by bulk fluid flow)

Phase Change Material, commonly referred to as PCM, shall mean a composition that stores and releases thermal energy (latent heat) during the processes of melting (liquefying) and freezing (solidifying). Phase Change Materials release large amounts of energy upon freezing in the form of latent heat but absorb equal amounts of latent energy upon melting. Phase Change Material also refers to substances which release and/or absorb latent energy upon reformation of its solid structure.

DETAILED DESCRIPTION

Figure 1:
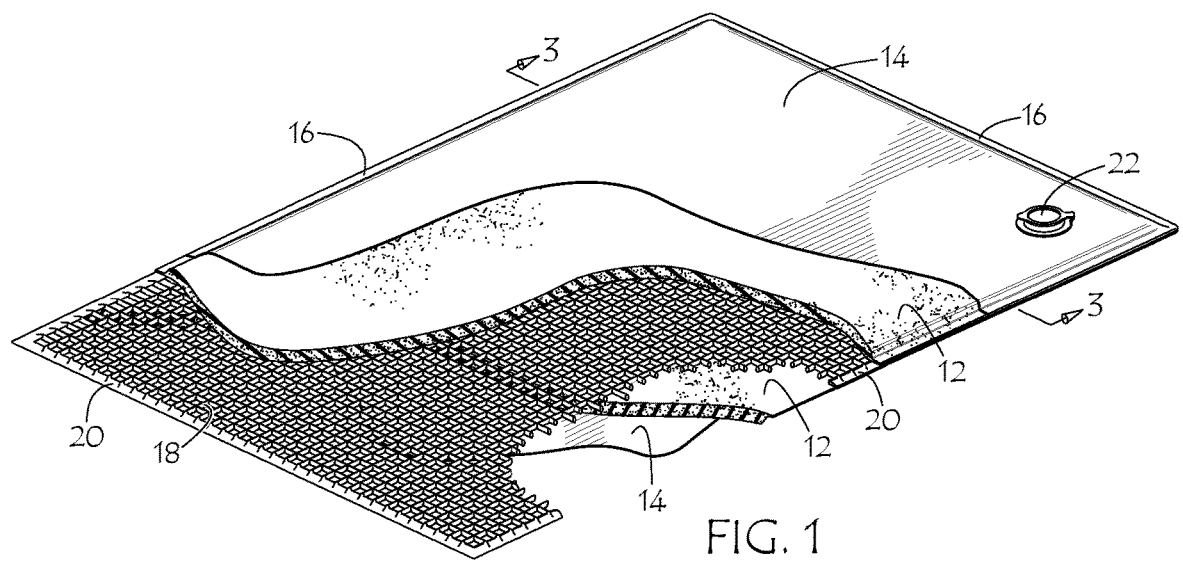
FIG. 1 is a top perspective view of a partial cut-away of the liquid saturated foam filled device containing PCM layered within the foam filler and encapsulated in a thermally transferring liquid impenetrable material having a grid-like structure.
Figure 3:
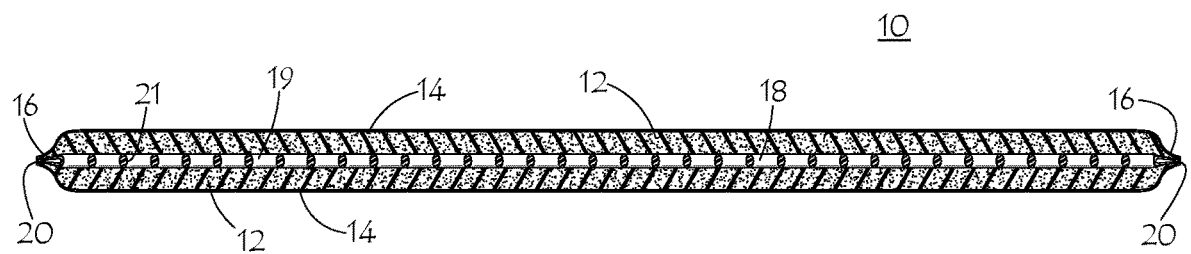
FIG. 3 is a cross section view of the liquid saturated foam filled device of FIG. 1 along lines 3-3.

FIG. 1 is a top perspective view of a partial cut-away of the PCM containing fluid saturated foam device 10 consisting of a liquid saturated foam core 12 enclosed in a flexible, liquid impervious membrane container 14. The membrane container 14 consists of two layers of flexible, liquid impermeable material which have been sealed along their edges to form a liquid tight membrane seal 16 completely along the perimeter of the PCM containing fluid saturated foam device 10. Disposed or "sandwiched" within the liquid saturated foam core 12 is a PCM containing grid 18 which is also sealed completely along its perimeter at PCM grid seal 20. As better seen in FIG. 3, the liquid saturated foam filler is enveloped in flexible deformable membrane 14, by means of membrane seal 16. PCM containing grid 18 is likewise sealed around its periphery by PCM grid seal 20. PCM grid seal 20 lies coincident with membrane seal 16 which are likewise sealed together to provide a single structure preventing the contents of the PCM containing fluid saturated foam device 10 from shifting and/or gathering. Further, as seen in FIG. 3, PCM containing grid 18 comprises PCM filled portions 21 of the grid 18 surrounding voids 19. In this manner, the migrating liquid within the PCM containing fluid saturated foam device 10 fills the voids 19 proximate the PCM filled portions 21 of the grid 18 of PCM containing grid 18 allowing migration of the liquid to provide heat transfer to or from the PCM. The liquid inlet/filler 22 is attached to one side of the flexible membrane 14 in communication with the interior thereof. The inlet/filler 22 is a funnel opening which is easily opened and closed by means of, for example, a pop cap having a pull tab.

Figure 2:
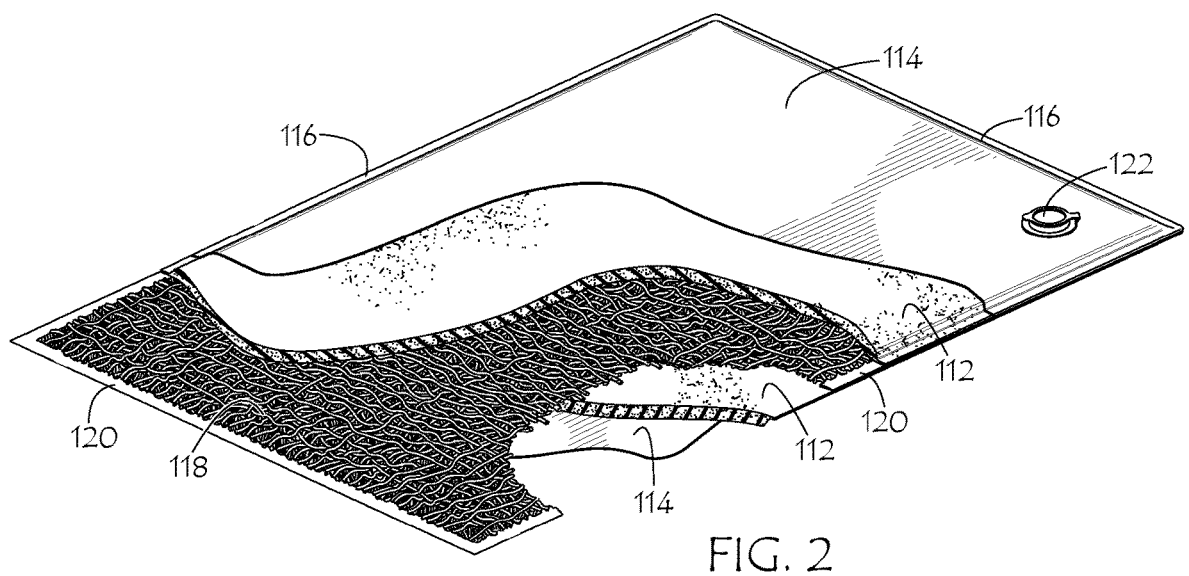
FIG. 2 is a top perspective view of a partial cut-away of the liquid saturated foam filled device containing PCM layered within the foam filler and encapsulated in a thermally transferring liquid impenetrable sealed extruded micro-thermally transferring liquid impenetrable micro-tubes layered (woven) into a mat.

FIG. 2 is a top perspective view of a partial cut-away of the PCM containing fluid saturated foam device 110 consisting of a liquid saturated foam core 112 enclosed in a flexible, liquid impervious deformable membrane container 114. The membrane container 114 consists of two layers of flexible liquid impermeable material which have been sealed along their edges to form a liquid tight membrane seal 116 along the perimeter of the PCM containing fluid saturated foam device 110. Disposed or "sandwiched" within the liquid saturated foam core 112 is a PCM containing "mat" 118 which is sealed along PCM "mat" seal 120. The PCM containing "mat" 118 is comprised of interwoven, sealed micro-tubes containing PCM. In this manner, the liquid migrating within the PCM containing fluid saturated foam device 110 moves within the liquid saturated foam core 112 through the PCM containing "mat" 118 transferring heat to or from the PCM through the micro-tube housing material. The inlet/filler 122 is a funnel opening which is easily opened and closed by means of, for example, a pop cap having a pull tab.

Figure 4:
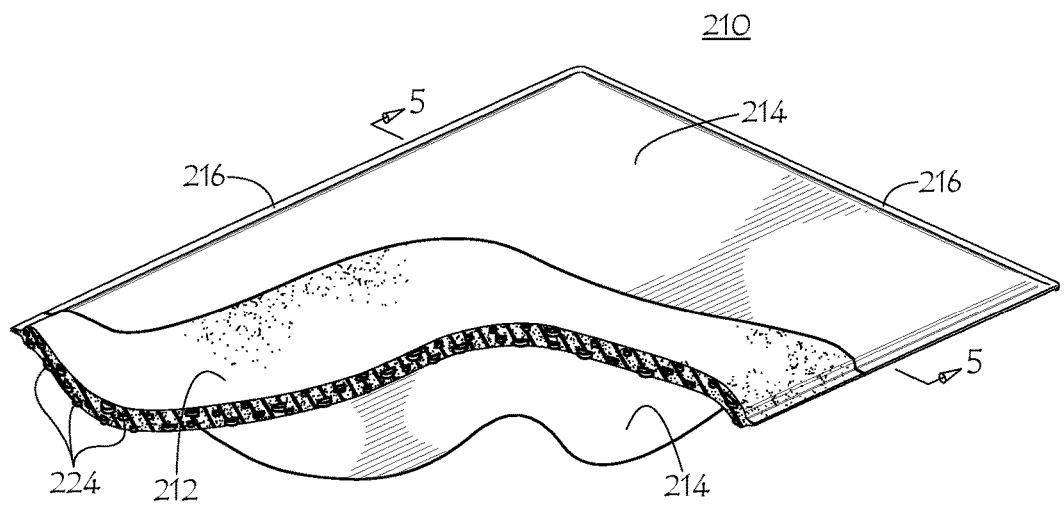
FIG. 4 is a top perspective view of a partial cut-away of the liquid saturated foam filled device containing PCM dispersed within the foam filler.

Turning to FIG. 4, there is shown a further embodiment of the PCM containing fluid saturated foam device 210. FIG. 4 is top perspective view of a partial cut-away of the PCM containing fluid saturated foam device consisting of a liquid saturated foam core 212 disposed in a flexible liquid impervious membrane 214. The flexible membrane 214 consists of two layers of vinyl sheets which have been sealed along their edges to form a liquid tight membrane seal 216. The liquid saturated foam core 212 has dispersed therein PCM filled disk-shaped vessels 224 of thermally transferring, liquid impermeable material containing PCM.

Figure 5:
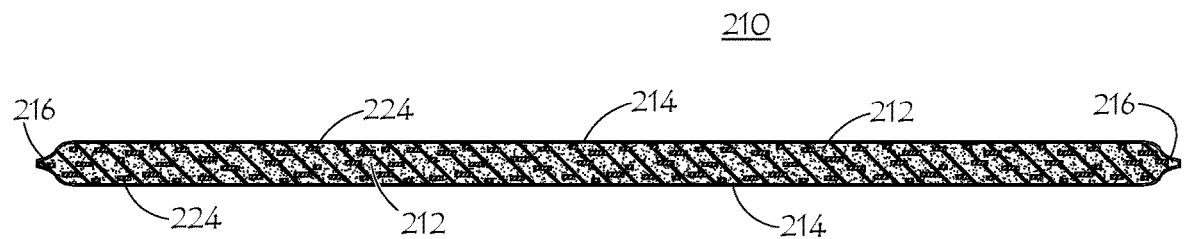
FIG. 5 is a cross-section view of a liquid saturated foam filled device of FIG. 4 along lines 5-5.

As better seen in FIG. 5, the PCM filled disk-shaped vessels 224 are distributed within the liquid saturated foam core 212 substantially in horizontal planes to provide maximum thermal exposure to the circulating liquid within the liquid saturated foam core 212. In this manner, the PCM containing disk-shaped vessels lie in multiple planes within the thickness of the liquid saturated foam core 212.

In operation, the devices shown in FIGS. 1, 2, and 4, are affective in actively transferring heat to and from the PCM situated within the liquid saturated foam disposed between and within the flexible membrane container. The device cools or heats a person or equipment in contact therewith by allowing conductive heat exchange between a person's body or the skin of the device and the liquid in the saturated foam core which is in contact with the PCM. This conducted heat is actively transferred by the motion of the liquid to or from the PCM which is in contact with the liquid within the device to cool the surface of the device, as well as preventing "hot spots" thus maintaining a substantially uniform temperature throughout the device.

In one embodiment, the membrane containing the PCM is permeable by the device-liquid and may comprise a vinyl sheet encapsulating the PCM and containing tiny orifices through which the device liquid may pass. In a further embodiment, the liquid, which migrates through the foam by thermal convection, comes in intimate contact with the thermally transferring, liquid impenetrable vessel or structure containing the PCM, to actively cool or heat the device. In another embodiment, the liquid, which migrates through the foam by thermal convection, comes in intimate contact with a liquid permeable vessel containing the PCM. The liquid permeable container comprises an osmotic transfer membrane (mole sieve) to allow the liquid circulating within the device to pass therethrough, but preventing the liquid phase of the PCM from passing through the membrane, thus retaining the PCM within the liquid permeable container. In this manner, the migrating liquid within the device comes in direct contact with the solid PCM allowing an endothermic phase change directly at the face of the PCM material.

Thus, when the user brings at least a portion of their body or piece of equipment into intimate contact with the flexible membrane containing the liquid saturated foam filler, the action of the liquid saturated foam in cooperation with the PCM and the outer membrane supports the user or equipment and simultaneously provides active thermal regulation.

For example, as a heat source is brought in contact with the surface of the flexible membrane, the liquid in the device in contact therewith absorbs heat which by way of convection (and physical motion, depending upon use) through the foam filler transfers the heat to the PCM affecting an endothermic phase change. Thus, the heat retained and transported by the liquid is "absorbed" by the PCM causing it to undergo an endothermic physical phase change from solid to liquid causing the liquid circulating within the device to cool, Once the PCM containing fluid saturated foam device is no longer in contact with the heat load, the process reverses itself exothermically, resulting in a PCM undergo from liquid back to solid.

As another example, when used by humans, the temperature of the liquid may be initially at room temperature which is lower than human body temperature. A user may also adjust the initial temperature of the liquid by filling the container with a liquid at the desired temperature or placing it in a cooler environment. By actively dispersing a person's body heat throughout the device which heat is "absorbed" by the PCM during, the flexible membrane surface remains uniformly cool providing a constant cool surface.

Flexible Membrane Container

The flexible membrane container can be made of any liquid impervious material which has flexibility sufficient to allow the saturated foam core to provide support. The flexible membrane container need be of a material which will not react with the liquid within the device. When water is used as the device liquid, thin vinyl sheets, which can be radio-sealed at their periphery, are ideal for providing this flexible membrane container. When organic liquids and/or those liquids with higher or lower pH are used, the flexible membrane needs to be of a material that retards and/or is otherwise non-reactive with the device liquid. In accordance with the use of the device for support and/or cooling of nonindustrial electronic equipment, such as laptop computers and the like, vinyl sheets have been shown to be adequate. Likewise, when using the device for support and/or cooling of animals or humans, vinyl sheets having a thickness of about from 2 millimeters to 100 millimeters and preferably from 8 millimeters to 18 millimeters have been found sufficient.

Foam Core

The saturated foam core provides support stability to the device, as a whole, while allowing migration by convection (and loads on the device) of the liquid such that the liquid moves into intimate contact with the PCM as previously described. The foam core and the liquid cooperate within the confines of the outer membrane to provide a thermally active device having both flexibility and structural stability.

It will be realized by those skilled in the art that the more "closed" the cellular structure of the foam, the more mechanical support provided by the liquid saturated foam filled device. However, the more closed the cell structure, the less mobility of the liquid within the foam; hence, the less mixing of the liquid contained within the foam and the less heat transferred to the PCM. It will also be realized that the liquid must permeate substantially all the cells of the foam to be effective and that the liquid can be selected such that certain heat capacity characteristics are imbued to the device as a whole.

The core may, for example, consist of reticulated foam composed of polyurethane which contains pores. The foam is preferably of an open pore structure allowing substantially free mobility of the liquid within the foam. The foam core can be processed with an acid treatment or sonic treatment to result in larger pore sizes and is available in, for example, pore densities ranging from 10 pores per inch (PPI) to 60 PPI and preferably a pore density of about 20 PPI. At this pore density, the foam core is stable and is able to retain essentially all of the liquid within the structure of the core. In this manner, both noise and the risk of leakage is reduced if the outer flexible membrane is punctured or torn.

Additionally, there is essentially no noise of liquid flow such as sloshing or splashing in that there is substantially no free liquid within the flexible outer container, in that the liquid is "soaked up" and retained within the foam. Risk of leakage is reduced due to liquid being retained in the foam and not as freely mobile to leak out of a puncture or a cut. Further, because all the liquid is evenly distributed throughout the core, the liquid does not tend to pool in one spot.

It will be realized by the skilled artisan that the material from which the foam is made must be of the substance which is essentially inert to the device liquid. Alternatively, the foam can be formed of a material which has been treated to render it relatively inert to the device liquid. When organic liquids or liquids with relatively higher or lower pH are used, the foam core material need be selected to prevent substantial degradation of the device.

Device Liquid

The device liquid that can be used in accordance with the instant device vary depending upon the application. Generally, liquids having a higher heat capacity are preferred. Additionally, because the liquid migrates within the foam core to transfer heat to and from the PCM, the liquid need be of sufficient viscosity to migrate freely within the foam structure while still being of sufficient density to provide device support. In addition, the liquids may be inorganic, e.g. water; or organic, e.g. substituted biphenyls preferably having a freezing point below about 65° F. Although thermal conductivity (convection) is of import in the device liquid, electrical conductivity of the device fluid is not preferred for some applications. For example, with devices used to cool electronic equipment or used in conjunction with electrical components electrical conductivity should be minimized to prevent shorting out in the event of a leak in the device. Although water is the preferred liquid because of availability and accessibility, other organic compounds are useful for devices in contact with and for cooling electrical equipment such as computers or the like. In this regard, liquid such as saturated biphenyls are particularly advantageous, although chlorinated biphenyls (PCBs) are legally banned as carcinogens. It will be realized by the skilled artisan that the level of saturation of the biphenyl molecule is primarily determined by the melting point of the substance such that it remains a free flowing liquid at operating temperatures.

In accordance with one embodiment, the device can be used in association with electrical equipment such as servers, computers and the like, both as an active closed system cooling device and as a support such as, for example, a laptop on an airplane. When such electrical devices are cycled on and off, the PCM undergoes an endothermic phase change initially during active cycle and exothermic phase change during the off cycle.

When the device is used with human interface, it is preferable to use non-toxic liquids to prevent contamination upon spillage or leakage. In this regard, water is an ideal liquid.

Phase Change Material

The PCM can store large amounts of latent heat which is released (absorbed) by phase change or reformation of the solid without affecting the sensible heat (temperature) of the surrounding medium. "Melting" (changing phase from solid to liquid) is accompanied by a small volume change, usually less than 10%. Thus, melting and solidification of the PCM proceeds at a constant sensible temperature. This is called the "phase change temperature." If the melting is completed, further transfer of heat results in sensible heat (temperature) rise.

The PCMs that can be used in accordance with the instant device vary depending upon application. The following discussion is for purpose of example and not limitation. Organic Paraffins ($C_nH_{2n+2}$) and fatty acids ($CH_3(CH_2)_{2n}COOH$)) are able of use as PCMs. These organic compounds have the advantage of melting congruently with self-nucleating properties. In addition, these compounds have shown compatibility with conventional material of construction, are chemically stable, with a high heat of fusion. They have been shown to be relatively safe and non-reactive, as well as being recyclable.

These organic compounds have the disadvantage of low thermal conductivity in their solid state, high heat transfer rates required during the freezing cycle, and lower volumetric latent heat storage capacity. Many are flammable and can be relatively expensive.

Another class of PCMs is the salt hydrates ($M_xH_2O$). These compounds have the advantage of a relatively high volumetric latent heat storage capacity, sharp melting points, high thermal conductivity, and high heat of fusion. They are non-flammable, readily available and relatively low cost. They have the disadvantage of having a relatively high volume change.

Examples of organic PCMs include saturated straight chain alkanes such as, tetradecane, hexadecane, octadecane, eicosane, tetracosane, hexacosane, and octacosane; fatty alcohols, such as capric alcohol, lauryl alcohol, myristyl alcohol, cetyl alcohol, and stearyl alcohol; and, fatty acids, such as caprylic acid, capric acid, lauric acid, myristic acid, palmitic acid, stearic acid.

Many polymers undergo an endothermic phase change within a specific temperature range. There are several types of such phase-change polymers. Low-melting polymers such as Poly(ethylene glycol), pluronic and Poly(caprolactone) undergo a melting transition at temperatures ranging from 15 C to 60 C. Another class of polymers is the temperature-responsive polymers that undergo a coil-to-globule transition at critical temperatures. For example, such polymers may undergo a phase change at a critical temperature known as the Lower Critical Solution Temperature (LCST) or at a critical temperature known as the Upper Critical Solution Temperature (UCST). At the LCST, polymers transition from a single phase into a two-phase system. Such polymers include, among others, Poly(N-isopropylacrylamide), Hydroxypropyl methylcellulose (HPMC), and Poly (diethylacrylamide).

A critical temperature for phase change can be adjusted to a desired range through copolymerization with more hydrophilic polymers or hydrophobic polymers to increase or decrease the temperature, respectively. Some polymers are known to undergo a coil-to-globule transition, which is an endothermic phase transition leading to significant heat absorption, generally in the range of about 50-200 J/g.

Although the present invention has been described with reference to preferred embodiments, numerous modifications and variations can be made and still the result will come within the scope of the invention. No limitation with respect to the specific embodiments disclosed herein is intended or should be inferred.

What is claimed is:

1. A thermal regulating cushioning support device containing an active medium for regulating the temperature of the device comprising:
   (a) a flexible, deformable liquid impervious outer membrane being adapted to sealably receive a liquid therein;
   (b) a foam core, encased within and in intimate contact with, but not bonded to, the flexible, deformable liquid impervious sealed outer membrane wherein the foam core has a dimension substantially coincident with the outer membrane;
   (c) a device liquid being sealably contained and in contact with the flexible, deformable liquid impervious sealed outer membrane and saturating the foam core, the device liquid being at least partially circulatable through the foam core;
   (d) a phase change material contained within a thermally transferring, liquid impenetrable flexible structure, disposed within the flexible, deformable liquid impervious sealed outer membrane and in contact with the device liquid such that the circulation of the device liquid is effective to transfer heat between the flexible, deformable liquid impervious sealed outer membrane and the phase change material; and wherein the saturated foam core in cooperation with the sealable flexible membrane provides structural support and a substantially uniform, thermal regulating medium such that the device is readily, uniformly deformable when the load is applied to said deformable liquid impervious sealed outer membrane.

2. The thermal regulating cushioning support device of claim 1 wherein the thermally transferring liquid impenetrable material structure has a grid-like configuration which allows said device liquid to circulate there through such that the circulation of the device liquid is effective to transfer heat between the flexible, deformable liquid impervious sealed outer membrane and said contained phase change material.

3. The thermal regulating cushioning support device of claim 1 wherein said thermally transferring liquid impenetrable material being in the form of sealed, extruded micro-tubes, said tubes being placed in a mat configuration having a structure which allows said device liquid to circulate there through such that the circulation of the device liquid is effective to transfer heat between the flexible, deformable liquid impervious sealed outer membrane and said encapsulated phase change material.

4. The thermal regulating cushioning support device of claim 1 wherein said phase change material is encapsulated in disks of thermally transferring liquid impenetrable material which lie in substantially horizontal planes within the foam core and in contact with the circulating device liquid.

5. The thermal regulating cushioning support device of claim 1 wherein the device liquid is selected from a group consisting of water and saturated biphenyl having a freezing point below about 65° F.

6. The thermal regulating cushioning support device of claim 1 wherein the phase change material is selected from group consisting of organic paraffins ($C_nH_{2n-2}$), fatty acids ($CH_3(CH_2)_{2n}COOH$)), salt hydrates ($M_nH_2O$), and fatty alcohols ($CH_3(CH_2)_{2n}COH$).

7. The thermal regulating cushioning support device of claim 1 wherein said phase change material is contained in a thermally transferring liquid impenetrable structure in contact with the circulating device liquid and the foam core wherein the structure of the thermally transferring liquid impenetrable material allows said device liquid to circulate there through such that the circulation of the device liquid is effective to transfer heat between the flexible, deformable, liquid impervious, sealed outer membrane and said structure containing the phase change material and wherein said structure allows the PCM in its liquid state to flow there through.

8. The thermal regulating cushioning support device of claim 1 wherein the device liquid is water, the foam core comprises reticulated polyurethane foam having a porosity ranging from 10 pores per inch to 60 pores per inch, and the outer membrane comprises vinyl having a thickness ranging from 2 millimeters to 100 millimeters.

9. The thermal regulating cushioning support device of claim 1 further comprising a resealable liquid inlet/filler for ingress and egress of the device liquid.

10. A thermal regulating cushioning support device containing an active medium for regulating the temperature of the device in the absence of an external energy source comprising:
    (a) a flexible, deformable liquid impervious outer membrane being adapted to sealably receive a liquid therein and retain a load thereon;
    (b) a foam core, encased within and in intimate contact with, but not bonded to, the flexible, deformable liquid impervious sealed outer membrane wherein the foam core has a dimension substantially coincident with the outer membrane;
    (c) a device liquid being sealably contained and in contact with the flexible, deformable liquid impervious sealed outer membrane and saturating the foam core, the device liquid being at least partially circulatable through the foam core;
    (d) a phase change material contained within a thermally transferring, liquid impenetrable flexible structure situated within the flexible, deformable liquid impervious sealed outer membrane and disposed proximate the foam core and in contact with the device liquid such that the circulation of the device liquid is effective to transfer heat between the flexible, deformable liquid impervious sealed outer membrane and the phase change material contained within a thermally transferring, liquid impenetrable flexible structure; and, wherein the saturated foam core in cooperation with the sealable flexible membrane provides structural support and a substantially uniform, thermal regulating medium in the absence of external energy such that the device is readily, uniformly deformable when a load is applied to the deformable liquid impervious sealed outer membrane.

11. The thermal regulating cushioning support device of claim 10 wherein said phase change material is encapsulated in the thermally transferring liquid impenetrable structure having a grid-like structure disposed within the foam core wherein said structure allows said device liquid to circulate there through such that the circulation of the device liquid is effective to transfer heat between the flexible, deformable liquid impervious sealed outer membrane and said contained phase change material.

12. The thermal regulating cushioning support device of claim 10 wherein said phase change material is contained in a thermally transferring liquid impenetrable material said thermally transferring liquid impenetrable material being in the form of sealed, extruded micro-tubes, said tubes being configured as a mat having a structure which allows said device liquid to circulate there through such that the circulation of said device liquid is effective to transfer heat between the flexible, deformable liquid impervious sealed outer membrane and said contained phase change material.

13. The thermal regulating cushioning support device of claim 10 wherein the phase change material is encapsulated in disks of thermally transferring liquid impenetrable material which lie in substantially horizontal planes within the foam core and are in contact with the circulating device liquid.

14. The thermal regulating cushioning support device of claim 10 wherein the device liquid is selected from a group consisting of water and saturated biphenyl having a freezing point below about 65° F.

15. The thermal regulating cushioning support device of claim 10 wherein the phase change material is selected from group consisting of organic paraffins ($C_nH_{2n+2}$), fatty acids ($CH_3(CH_2)_{2n}COOH$)), salt hydrates ($M_nH_2O$), and fatty alcohols ($CH_3(CH_2)_{2n}COH$).

16. The thermal regulating cushioning support device of claim 10 wherein the device liquid is water, the foam core comprises reticulated polyurethane foam having a porosity ranging from 10 pores per inch to 60 pores per inch, and the outer membrane comprises vinyl having a thickness ranging from 2 millimeter to 100 millimeters.

17. The thermal regulating cushioning support device of claim 10 further comprising a resealable inlet/filler for ingress and egress of the device liquid.

18. A thermal regulating cushioning support device having an active medium for regulating the temperature of the device comprising:
(a) a flexible, deformable liquid impermeable outer membrane being adapted to sealably receive a liquid therein;
(b) a foam core, encased within and in intimate contact with, but not bonded to, the flexible, deformable liquid impervious sealed outer membrane wherein the foam core has a dimension substantially coincident with the outer membrane;
(c) a device liquid being sealably contained and in contact with the flexible, deformable liquid impervious sealed outer membrane and saturating the foam core, the device liquid being at least partially circulatable through the foam core;
(d) a phase change material retained in a vessel which is at least partially a mole sieve membrane in contact with the circulating device liquid and the foam core wherein the mole sieve is effective in allowing the device liquid to flow through the membrane, while retaining the phase change material in its liquid state within the vessel, wherein the circulation of the device liquid is effective to transfer heat between the flexible, deformable outer membrane and the phase change material; and, wherein the saturated foam core in cooperation with the sealable flexible membrane provides a substantially uniform, thermal regulating medium and structural support such that the device is readily, uniformly deformable when a load is applied thereto.

19. The thermal regulating cushioning support device of claim 18 wherein the device liquid is selected from a group consisting of water and saturated biphenyl having a freezing point below about 65° F.

20. The thermal regulating cushioning support device of claim 18 wherein the phase change material is selected from group consisting of organic paraffins ($C_nH_{2n+2}$), fatty acids ($CH_3(CH_2)_{2n}COOH$)), salt hydrates ($M_nH_2O$), and fatty alcohols ($CH_3(CH_2)_{2n}COH$).

* * * * *